United States Patent
Koellnberger et al.

(10) Patent No.: US 10,518,455 B2
(45) Date of Patent: Dec. 31, 2019

(54) METHOD FOR PRODUCING SILICONE MULTI-LAYER COMPOSITES

(71) Applicant: Wacker Chemie AG, Munich (DE)

(72) Inventors: Andreas Koellnberger, Kirchdorf (DE); Alfred Schwinghammer, Pfarrkirchen (DE)

(73) Assignee: WACKER CHEMIE AG, Munich (DE)

( * ) Notice: Subject to any disclaimer, the term of this patent is extended or adjusted under 35 U.S.C. 154(b) by 427 days.

(21) Appl. No.: 15/115,306

(22) PCT Filed: Jan. 23, 2015

(86) PCT No.: PCT/EP2015/051404
§ 371 (c)(1),
(2) Date: Jul. 29, 2016

(87) PCT Pub. No.: WO2015/113911
PCT Pub. Date: Aug. 6, 2015

(65) Prior Publication Data
US 2017/0008210 A1    Jan. 12, 2017

(30) Foreign Application Priority Data
Jan. 30, 2014 (DE) .......... 10 2014 201 689

(51) Int. Cl.
*B29C 41/00*    (2006.01)
*B29C 48/00*    (2019.01)
(Continued)

(52) U.S. Cl.
CPC .......... *B29C 48/0014* (2019.02); *B29C 35/02* (2013.01); *B29C 48/154* (2019.02); *B29C 48/21* (2019.02); *B29C 71/0009* (2013.01); *B32B 27/08* (2013.01); *B32B 37/26* (2013.01); *C08J 7/04* (2013.01); *C08J 7/042* (2013.01); *H01L 41/45* (2013.01); *B29C 2071/0027* (2013.01); *B29K 2083/00* (2013.01); *B29L 2007/008* (2013.01); *B29L 2009/00* (2013.01); *B32B 2037/243* (2013.01); *B32B 2037/268* (2013.01); *B32B 2038/0076* (2013.01); *B32B 2307/206* (2013.01); *B32B 2309/105* (2013.01); *B32B 2309/14* (2013.01); *B32B 2553/00* (2013.01); *C08J 2367/02* (2013.01);
(Continued)

(58) Field of Classification Search
CPC .................................................. B29C 47/0047
USPC ....................................... 264/172.19; 118/419
See application file for complete search history.

(56) References Cited

U.S. PATENT DOCUMENTS

| 3,819,772 | A | 6/1974 | Kolobow | |
| 7,867,567 | B2 * | 1/2011 | Hasegawa | B05C 5/0254 118/325 |

(Continued)

FOREIGN PATENT DOCUMENTS

| DE | 2 045 558 A1 | 3/1971 |
| DE | 2 408 659 A1 | 8/1974 |
| EP | 0 097 313 A1 | 1/1984 |
| EP | 0 781 198 B1 | 7/1997 |
| EP | 1 971 720 B1 | 5/2013 |
| GB | 1 330 124 A | 9/1973 |

(Continued)

*Primary Examiner* — Galen H Hauth
(74) *Attorney, Agent, or Firm* — Brooks Kushman P.C.

(57) ABSTRACT

Multilayer silicone composites with precise thickness are produced by sequential extrusion of curable silicone films, and partially but not fully crosslinking a preceding silicone film prior to extruding a next subsequent film.

12 Claims, 6 Drawing Sheets

(51) Int. Cl.
*B29C 48/21* (2019.01)
*B32B 37/26* (2006.01)
*C08J 7/04* (2006.01)
*B29C 35/02* (2006.01)
*B29C 71/00* (2006.01)
*B32B 27/08* (2006.01)
*H01L 41/45* (2013.01)
*B29C 48/154* (2019.01)
*B32B 37/24* (2006.01)
*B32B 38/00* (2006.01)
*B29K 83/00* (2006.01)
*B29L 7/00* (2006.01)
*B29L 9/00* (2006.01)

(52) U.S. Cl.
CPC ........ *C08J 2383/04* (2013.01); *C08J 2383/07* (2013.01); *C08J 2483/04* (2013.01)

(56) References Cited

U.S. PATENT DOCUMENTS

| | | |
|---|---|---|
| 2007/0048457 A1 | 3/2007 | Ando et al. |
| 2010/0032082 A1* | 2/2010 | Ho .......................... B32B 27/40 156/222 |
| 2011/0014482 A1* | 1/2011 | Zhu ....................... B01F 5/0641 428/447 |
| 2013/0122217 A1 | 5/2013 | Akagi |

FOREIGN PATENT DOCUMENTS

| | | |
|---|---|---|
| JP | 2003311911 A2 | 11/2003 |
| JP | 2005350582 A2 | 12/2005 |
| JP | 2007083228 A2 | 4/2007 |
| WO | 2007081205 A1 | 7/2007 |
| WO | WO 2007081205 * | 7/2007 |
| WO | 2012011377 A1 | 1/2012 |
| WO | 2013034549 A2 | 3/2013 |

* cited by examiner

METHOD FOR PRODUCING SILICONE MULTI-LAYER COMPOSITES

CROSS REFERENCE TO RELATED APPLICATIONS

This application is the U.S. National Phase of PCT Appln. No. PCT/EP2015/051404 filed Jan. 23, 2015, which claims priority to German Application No. 10 2014 201 689.4 filed Jan. 30, 2014, the disclosures of which are incorporated in their entirety by reference herein.

BACKGROUND OF THE INVENTION

1. Field of the Invention

The present invention relates to the continuous production of multilayer composites which consist of at least two layers of silicone elastomer, the thickness of the individual layers being between 0.1 and 200 µm and the thickness precision is ±5% measured over an area of 200 cm², and also to the silicone films produced by this method, and to their use.

2. Description of the Related Art

EP1971720B1 describes the production of multilayer composites on a carrier, where at least two layers are applied before crosslinking takes place. The method described has the disadvantage that the required thickness precisions of the individual layers are not achieved.

EP0781198B1 describes multilayer adhesive constructions which in addition to the layer material comprise a barrier layer and also an adhesive layer, in order to minimize the migration of the migratable additive present in the adhesive layer. This method as well does not allow the desired layer thickness to be produced while maintaining thickness precision at the same time.

EP0097313A1 describes the production of a thin film of silicone elastomer, having a film thickness of between one and 500 µm and, during production, being applied to a coated paper. This is done using the coating techniques of roller coating, air doctor or reverse roll coating, wire-wound bar coating or spray coating in order to produce thin films. These techniques lead to films which do not have the required thickness precisions.

DE2408659 describes a method for producing thin, flawless silicone films, in which the film of silicone is produced by casting a centrifuged silicone material to which solvent has been added. The costly and inconvenient method is unsuitable, however, for industrial production in a continuous process. Moreover, the thickness precisions required are not achieved by means of casting processes.

As the prior art shows, silicone films in a thickness range starting from about 200 µm and up to several mm can be produced by extrusion methods or molding methods. The respective methods here exhibit different disadvantages. In the case of discontinuous molding methods, a reduction in the layer thickness is accompanied by problems during automatic demolding, and, moreover, the production costs per square meter (sq. m.) of film are higher than in the case of continuously operating processes. Extrusion methods of HTV rubbers have the disadvantage of relatively large variations in thickness, and also of the limited possibility, owing to plant design and slot swelling, of reducing the layer thicknesses below 200 µm.

In addition to the absolute layer thickness, the uniformity of the layer thickness over the whole of the web produced is a critical factor for applications of the composites in, for example, optical, electrical or medical sectors.

Composites of this kind with thicknesses of the respective individual silicone layer of between one and about 250 µm may be situated in particular in the area of dielectric electroactive polymers (EAP for short), where the silicone layer is used as a dielectric in a flexible, capacitor-like construction. Applications thereof in actuators, sensors, or generators are based on the conversion of electrical energy into mechanical energy or of mechanical energy into electrical energy. Such composites, moreover, have exacting requirements in terms of their mechanical properties, in order to minimize maintenance costs, since they are subject to continual mechanical load.

SUMMARY OF THE INVENTION

An object, therefore, was to provide a continuous method for producing thin multilayer silicone composites, having very thin and very uniform silicone layer thicknesses, and also having high surface quality and high long-term load resistance, and good or improved mechanical properties with respect to the overall composite. Surprisingly, these and other objects were achieved by the method of the invention for producing multilayer silicone composites, in which at least two layers consist of cured silicone each with a layer thickness of 0.1 to 200 µm, and with a thickness precision of the silicone layers of ±5% as measured over an area of 200 cm², by a multistep process with an angled slot die and travel speed, and with a dynamic viscosity of the silicone being between 100 and 1000 mPa·s.

DETAILED DESCRIPTION OF THE PREFERRED EMBODIMENTS

Figure 1:
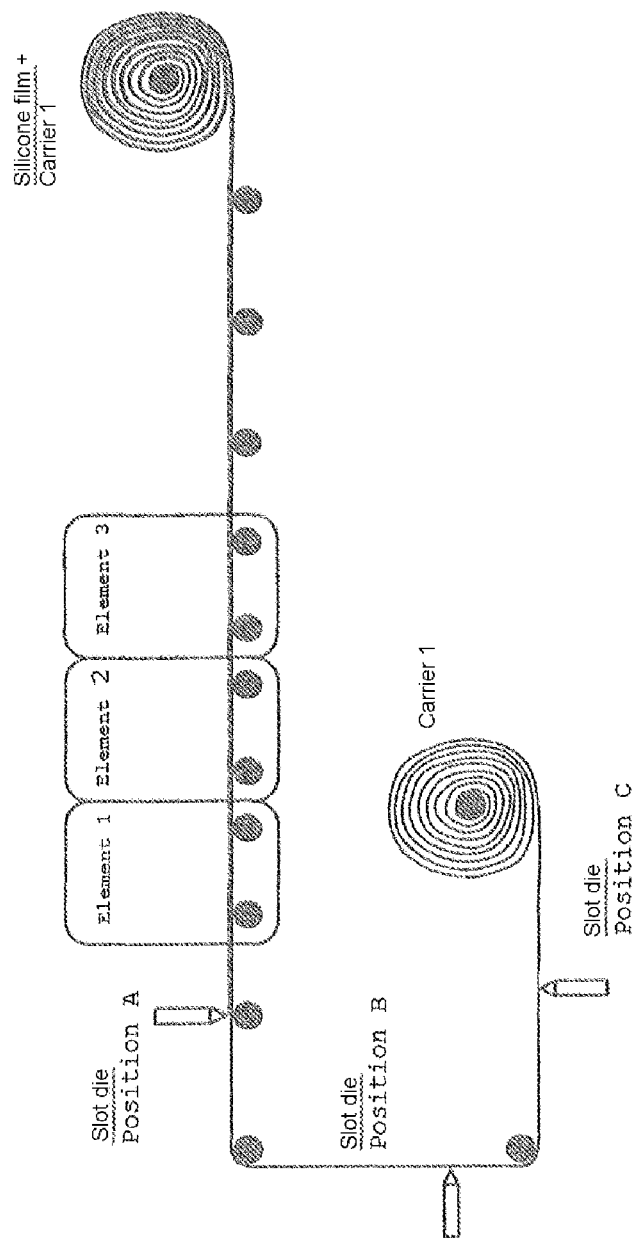
FIG. 1 illustrates one embodiment for the production of multilayer composites.

The inventive process particularly characterized, in that:
i) a solvent-containing or solvent-free, crosslinkable silicone composition (X) is applied through the slot of a slot die to a moving carrier,
ii) subsequently the solvent, if present, is removed from the silicone layer which forms on the carrier film, and the silicone layer is partially or wholly crosslinked,
iii) optionally intermediate layers are applied,
to give a 1st layer composite, composed of carrier, one crosslinked silicone layer, and optionally intermediate layers,
iv) a solvent-containing or solvent-free, crosslinkable silicone composition (X) is applied through the slot of a slot die to the moving 1st layer composite,
v) subsequently the solvent, if present, is removed from the silicone layer which forms on the 1st layer composite, and the silicone layer is partially or wholly crosslinked,
vi) optionally steps iii) to v) are repeated at least once more, vii) optionally there is a final crosslinking of the silicone layers, if only partial crosslinking took place in steps ii) and v), viii) subsequently the resulting multilayer silicone composite can be separated from the carrier, with the following provisos:

the slot die in step i) and iv) is at an angle of between 10° and 90° to the carrier;

the travel speed of the carrier and of the 1st and also further layer composites in steps i) and also iv) is between 0.1 and 1000 m/min;

the dynamic viscosity at 25° C. of the silicone composition (X), measured according to DIN 53019, is between 100 mPa·s and 1000 Pa·s, the surfaces of the carrier contain no depressions or elevations which are larger than 5% of the film thicknesses to be produced, and particles which are greater than ⅓ of the individual silicone layer thickness are removed from the crosslinkable silicone composition (X) before it is used.

The layer thickness and also the surface quality can be measured both directly during production (in-line) and also subsequently (off-line). Suitable techniques are commercially available measurements, for example, optical techniques such as confocal or scanning electron microscopy, triangulation methods, contactless and nondestructive physical techniques such as ultrasound absorption measurement, Eddy current sensors, capacitance sensors, transmission and absorption of X-rays, or other kinds of radiation.

If the absolute layer thickness is measured by means of an SEM analysis (scanning electron microscope analysis), it is carried out with a cryosection. The surface quality and roughness are determined for example by means of a confocal microscope. In the production of the individual layers, moreover, a web protocol may be recorded for each individual layer, meaning that each measurement of the layer thickness of a defined point (determined in accordance with the x- and y-axes of the web) is stored electronically.

In order to produce multilayer silicone composites which have, moreover, an improved overall mechanical stability, preference is given to operating with partial crosslinking of the silicone layers. For this purpose, the crosslinking conditions during the production of the individual layers in step ii) and v) are selected such that the silicone undergoes only partial crosslinking, and so achieves at least 40% of its ultimate properties, based in particular on the development of the nodal points, in other words having a degree of crosslinking of at least 40%. As a result, reactive groups also remain on the surface of the silicone layer, and subsequently crosslink with the reactive groups of the next silicone layer and so contribute to improved adhesion between the silicone layers. The degree of crosslinking is determined by way of suitable measurement techniques by means of material-specific calibration via a calibration series determined beforehand. This technique is known to those skilled in the art. In the case of addition-crosslinking compositions, for example, the degree of crosslinking is determined in a direct measurement by means of infrared spectroscopy, by measuring the unreacted functionalities of Si—H or Si-vinyl groups. Depending on the material used, in the case of addition crosslinking, for example, there are still Si—H groups or Si-vinyl groups present in the fully vulcanized material. In the case of only partially vulcanized samples, in contrast, both functionalities are present in the material. For this reason, material-specific calibration of the measurement setup via a calibration series is necessary, this series being adapted to the particular material. For the infrared detection of the Si—H function, for example, the band at 2160 cm$^{-1}$ can be used; in the case of the Si-Vi function, the band at 3050 cm$^{-1}$ is customarily recruited for the measurement. This measurement may take place both within the production line (in-line) and also by sampling and subsequent determination (off-line).

Where condensation-crosslinking, peroxidically crosslinking or otherwise-crosslinking silicone compositions are used, the infrared measurement may be adapted to the respective functional groups present that are responsible for the crosslinking reaction.

Indirectly, the degree of crosslinking of the silicone layer may also be ascertained through determination of the hardness (penetration, Shore 00, Shore A or Shore D). Here again, depending on the material used, a calibration series is established using the appropriate measurement technique, and is used to establish the desired degree of crosslinking for the silicone layers. Suitable techniques are known to the skilled person from, among others, DIN, ASTM, JIS, and ISO protocols.

The crosslinking conditions are set preferably in step ii) and v) independently of one another in such a way that the silicone layers have at least 50% degree of crosslinking. In one preferred embodiment, the conditions are set such that the silicone layer produced has at most a 90% degree of crosslinking, and more particularly at most 80% and most preferably at most 70%.

Before the second silicone layer is applied, at least one interlayer not based on silicone may be applied, via the additional step iii). Examples of such are electrically or thermally conducting webs or layers, metal foils, woven fabrics, fibers, barrier layers, etc., which can be applied to the silicone layer by various technologies with which the skilled person is familiar. Examples of such techniques are as follows: laminating, coating technologies such as printing, spraying, knife coating, slot die methods, dispensing technologies, chemical vapor deposition, physical vapor deposition.

This is also one of the great advantages of the method described here, which permits automated, industrial manufacture of stacked constructions on the basis of dielectric elastomers (DEA). Following realization of at least one capacitor-like construction, deformation of the system as a whole can be brought about by the application of electrical voltage (principal of the actuator). A further advantage of the multilayer composites produced by the method described is that the breakdown voltage of the silicone elastomer layer as measured to ASTM D 3755 is at least 25 kV/mm, preferably at least 30 kV/mm, more preferably at least 35 kV/mm, and most preferably at least 40 kV/mm. Depending on application, a multiplicity of arrangements or constructions comprising the multilayer composites are conceivable, and may be achieved by stacking, folding, rolling, etc.

Further applications of the multilayer silicone composites of the invention produced by the method claimed are as follows: barrier films in the medical or food sector, insulating tapes, protective films (keyboards, skin protection, oral protection, glass/scratch protection for various materials), packaging of all kinds (foods, plants), carrier films for wound contact materials, functional layers in clothing, substance separation or gas separation layer (gas separation, seawater desalination, . . . ), carrier film, cooking film or kitchen film, films for display applications, airbags, or wine corks.

Surprisingly it has been found that all of the disadvantages described above for the processes known from the prior art do not occur with the method described here, using a slot die in combination with a planar carrier, and the method claimed allows the very precise production of multilayer, silicone-based composites which, moreover, permit an improvement in the mechanical properties of the final multilayer silicone composite as a result of working with partial crosslinking of silicone layers.

The preferred embodiments of individual features of the present invention, disclosed below at different places in this text, should be understood such that the combinations of these features in their preferred embodiments are also particularly preferred.

The method of the invention is carried out as far as possible in the absence of particles. Absence of particles means that during the overall process of layer production, care must be taken to ensure that as few as possible of particles, whether in the form of active or inert fillers possibly incorporated by mixing, or in the form of extraneous particles, are included that are greater than about ⅓ of the desired layer thickness. For example, in a silicone film of the invention with a thickness of 24 μm, there are preferably no particles included with a diameter exceeding 8 μm. The removal of any particles present from the silicone composition (X) may take place in principle by all techniques known to the state of the art. Examples of such techniques are straining via strainer sieves (wire nets, wire braid), filter candles made of any of a very wide variety of materials (metal, plastic, ceramic, etc.), filtration techniques such as, for example, magnetic filtration, pressure filtration via filter presses, backflow filters, suction filters, etc., with or without filter aids such as activated carbon, metal oxides, etc. A further example of the removal of particles from the silicone composition (X) is centrifugation, and all of the methods stated or possible may take place in a batch process or continuously.

The method for producing the multilayer silicone composites from one or more silicone compositions (X) takes place preferably under clean-room conditions, in which there are no particles larger than 5 μm. For the design of the production equipment, this means that the noncrosslinked silicone compositions (X), following the removal of any particles present, are stored and processed only in clean rooms of class M4 or 100 (as per Federal Standard 209 E) or better, preferably in clean rooms of class 3 or 10 or better.

The carrier material used as carrier plays a minor role with regard to the production of the multilayer composites. Only the surface quality is critical, since elevations or depressions in the surface are taken on directly by the silicone composition (X). For this reason, the carrier materials used are preferably those whose surfaces are particularly smooth and contain no depressions or elevations which are greater than 5%, preferably 3%, of the film thicknesses to be produced. Examples of carrier materials are as follows: polyethylene, polypropylene, polyvinyl chloride, polystyrene, cellophane, polyesters (polyethylene terephthalate, polybutylene terephthalate, polycarbonate, polyethylene naphthalate), fluorine-containing polymers (polytetrafluoroethylene), metal strips or metal foils (as continuous strip or via the feed rolls depicted; all metals are possible, with or without surface coating). The thickness of the carrier material used likewise plays only a minor part. Preferred thicknesses for polymeric carriers or metal foils are 10 μm to 200 μm, while those for metal strips are 200 μm to 2 mm. Preferred carrier materials are metal foils, metal strips, and polymeric films of polyethylene, polypropylene, polyethylene terephthalate, polybutylene terephthalate, and also polytetrafluoroethylene.

The travel speed of the carrier for the production of the silicone films is customarily between 0.1 and 1000 m/min, preferably between 0.5 and 500 m/min, and more preferably between 1 and 100 m/min. With the method of the invention it is possible to achieve web widths of between a few centimeters and several meters, with the preferred width being between 10 cm and 4 m, more preferably between 20 cm and 3 m.

As a result of the use of a slot die, the thickness of the silicone layer produced is dependent only on the flow rate of material, which is set via the supplying pump, on the web speed, and on the density of the crosslinkable silicone compositions (X) used. The dynamic viscosity at 25° C. of the silicone compositions (X) as measured according to DIN53019 is between 100 mPa·s and 1000 Pa·s, preferably between 200 mPa·s and 500 Pa·s, and more preferably between 300 mPa·s and 100 Pa·s. Slot dies are known to the skilled person from the state of the art.

Described below are a number of embodiments of the method of the invention in exemplary form, using FIG. 1 to FIG. 6. These embodiments, however, should not be considered as exhaustive for the design forms of the method of the invention.

In one simple embodiment, the silicone films of the invention are produced on a production plant according to FIG. 1.

FIG. 1 serves for the simple illustration of the method of the invention. In the case of an arrangement as shown in FIG. 1, the silicone film is produced by the noncrosslinked silicone composition (X) being conveyed through the gap of the slot die in step i), with the feed rate and the speed of the carrier being adapted in such a way as to result in the desired layer thickness. The gap opening at the head of the slot die is customarily in the width range of the layer to be produced, with marked differences also being possible (as is also evident from the later examples). The distance of the slot die from the carrier is somewhat above the desired layer thickness of the film. For a silicone film 50 μm thick, the distance between the slot die and the carrier is usually between 55 μm and 500 μm. In the case of a 50 μm silicone film, the distance is preferably between 55 μm and 350 μm and more preferably between 55 μm and 200 μm.

The positioning of the slot die relative to the carrier may take place alternatively vertically from above (position A), horizontally (position B), or from below (position C). In all positions, A to C, the angle between the slot die and the carrier material in figure is 90°, but other angles are possible as described later on below. FIG. 1 depicts the elements 1 to 3 serving for step ii). The number of elements should be understood merely as an example and with no restriction on their number. Where silicone compositions (X) are used which contain no solvent, the use of a single element (for hot air, IR radiation, or UV radiation, for example) may be sufficient to bring about the partial and/or full crosslinking in step ii) to form the silicone film. In the case of silicone compositions (X) which include solvent, it is advantageous if the removal of the solvent and the step of crosslinking to give the silicone film are separated in process step ii), requiring at least two elements, element 1 and element 2. However, a plurality of elements in combinations may also be used for step ii). For example, in FIG. 1, element 1 serves to vent solvent, element 2 serves for full/partial crosslinking, and element 3 serves for aftertreating. When the silicone film has cured, it is collected or wound up together with the carrier in FIG. 1. Depending on the web speed and the onset temperature of the silicone composition (X), the lengths of the venting, crosslinking, and aftertreatment sections of the elements 1 to 3 may vary. The silicone film thus collected on carrier 1 is then used, for example, in the same apparatus or in a further apparatus, in accordance with FIG. 1, as carrier 1, for application of a further silicone layer as per step iv) and v). Steps iv) and v) may be repeated multiply until the desired number of layers has been reached. In the final running of steps iv) and v), subsequently, a final crosslinking is carried out, if beforehand at least one of the silicone layers has been only partially crosslinked.

Figure 2:
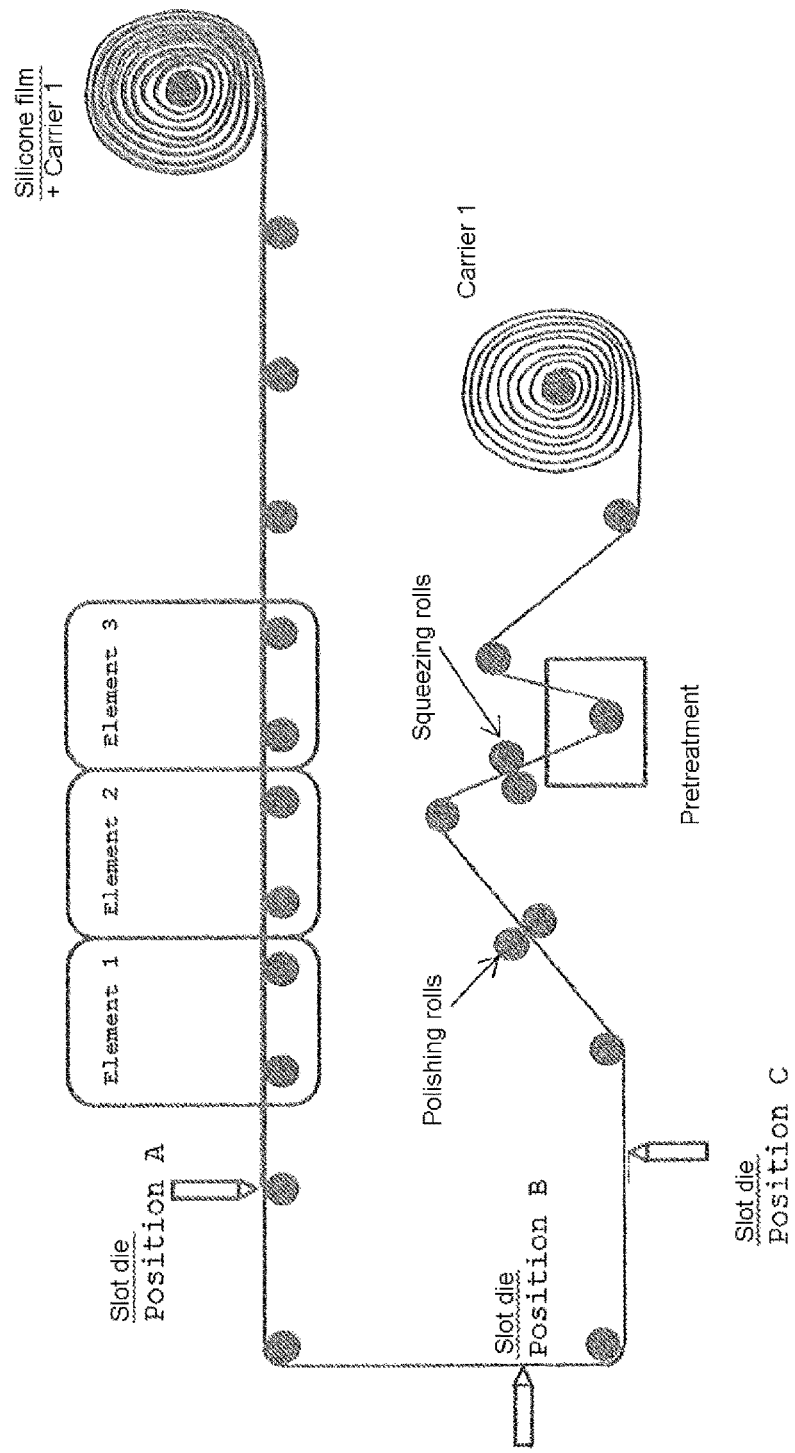
FIG. 2 illustrates another embodiment for the production of multilayer composites.

In FIG. 2, production takes place in the same way as for FIG. 1, with the additional process step ia) of a pretreatment of the carrier. This is a dipping treatment of the carrier. After the dipping treatment, the carrier is passed through squeezing rolls and polishing rolls in order to remove excess pretreatment material.

Here again, multilayer composites are obtained by a repetition of steps iii), iv) and v), with the second layer of silicone being applied in noncrosslinked form to the through-crosslinked or partially crosslinked first silicone layer from steps i) to iii).

Figure 3:
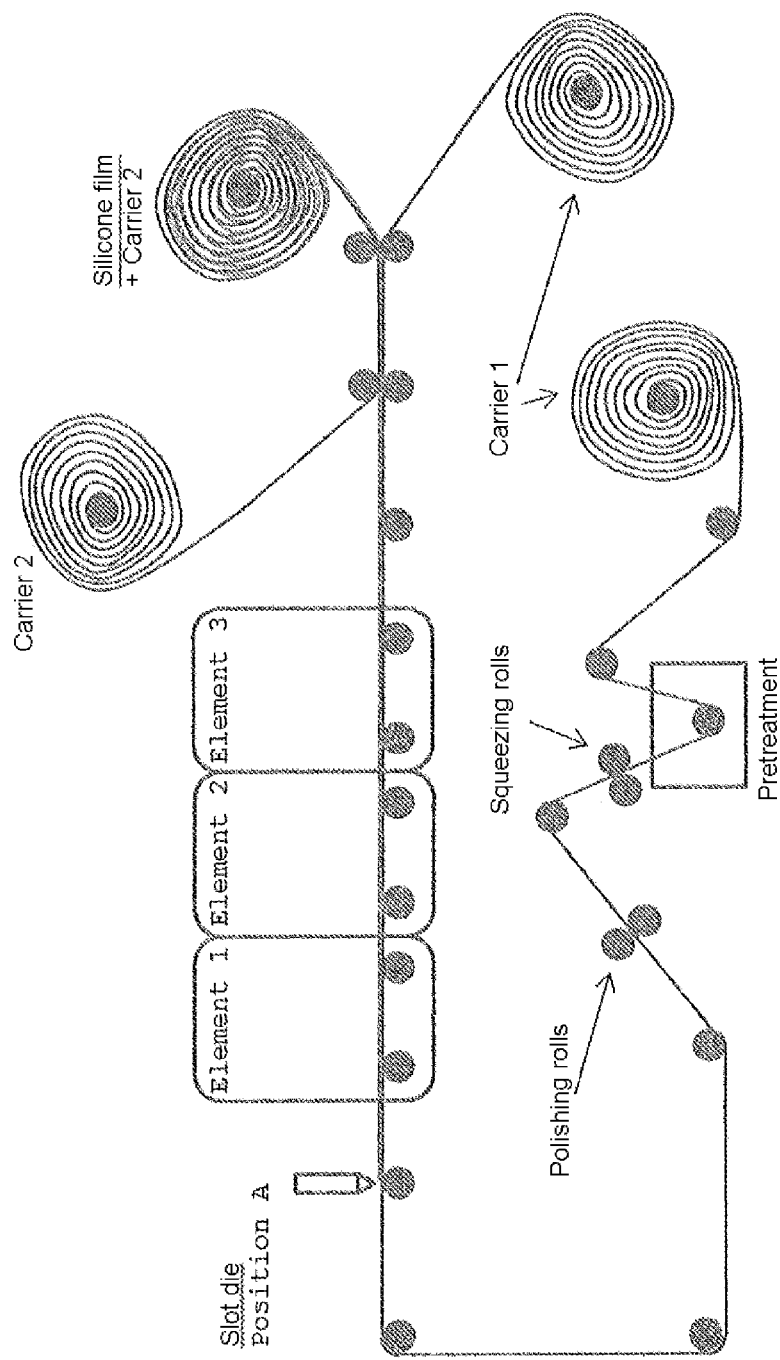
FIG. 3 illustrates a further embodiment for the production of multilayer composites.

In FIG. 3, production takes place in the same way as for FIG. 2, with the additional process step of the use of a second carrier, carrier 2, in step va) after the crosslinking to give the silicone film in accordance with step ii), in order to transfer the silicone film to a different carrier. Or else as a substep of step viii), if the multilayer silicone composite has been ready-produced, in order to separate it, as a final step, from the carrier 1. For this purpose the carrier 2 is applied to the surface of the silicone film or multilayer silicone composite and, with a slight offset (though it may also take place simultaneously), the silicone film or composite is parted from carrier 1 and collected together with carrier 2.

Figure 4:
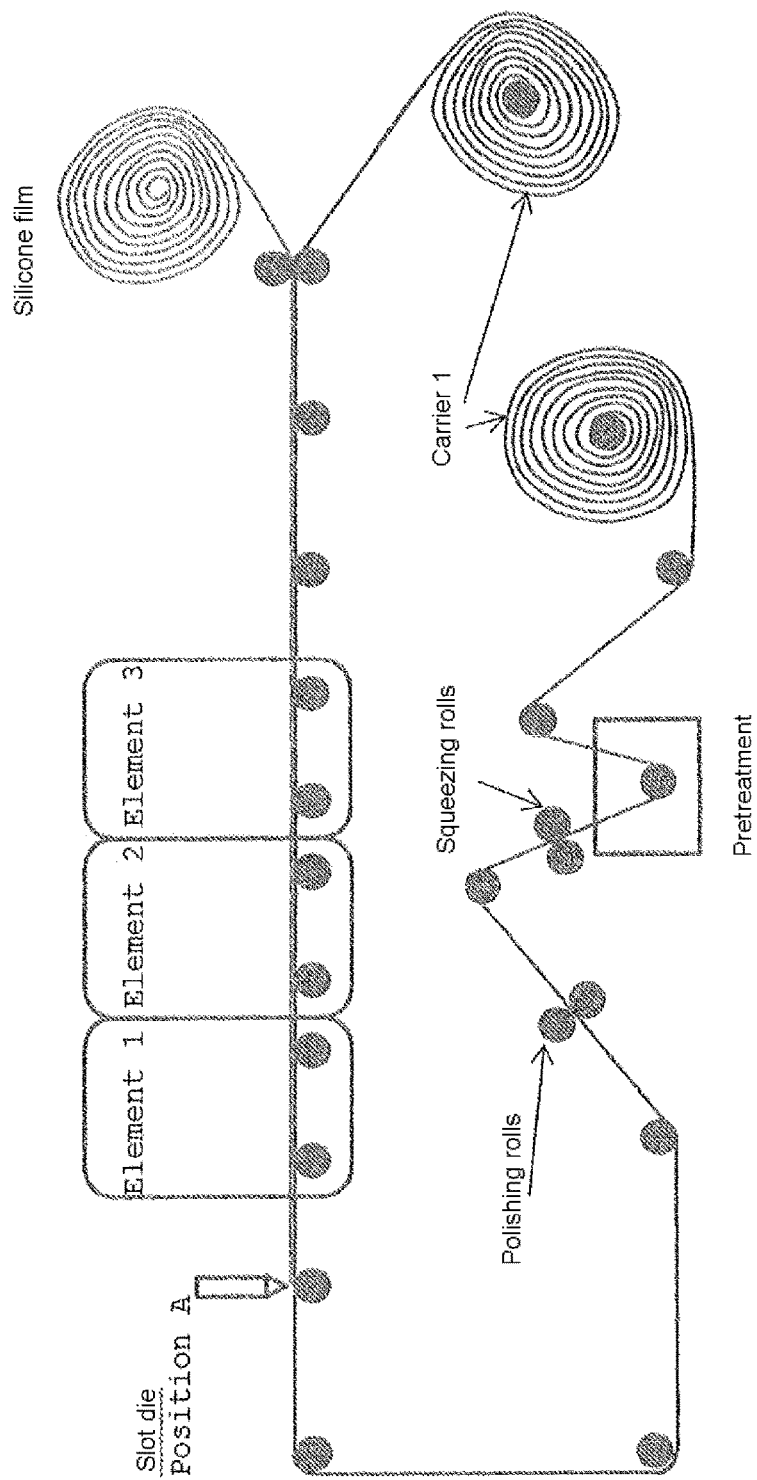
FIG. 4 illustrates a yet further embodiment for the production of multilayer composites.

In FIG. 4, production takes place in the same way as for FIG. 3, with the difference that the silicone film or the multilayer silicone composite is collected directly alone, without being transferred to a further carrier.

Figure 5:
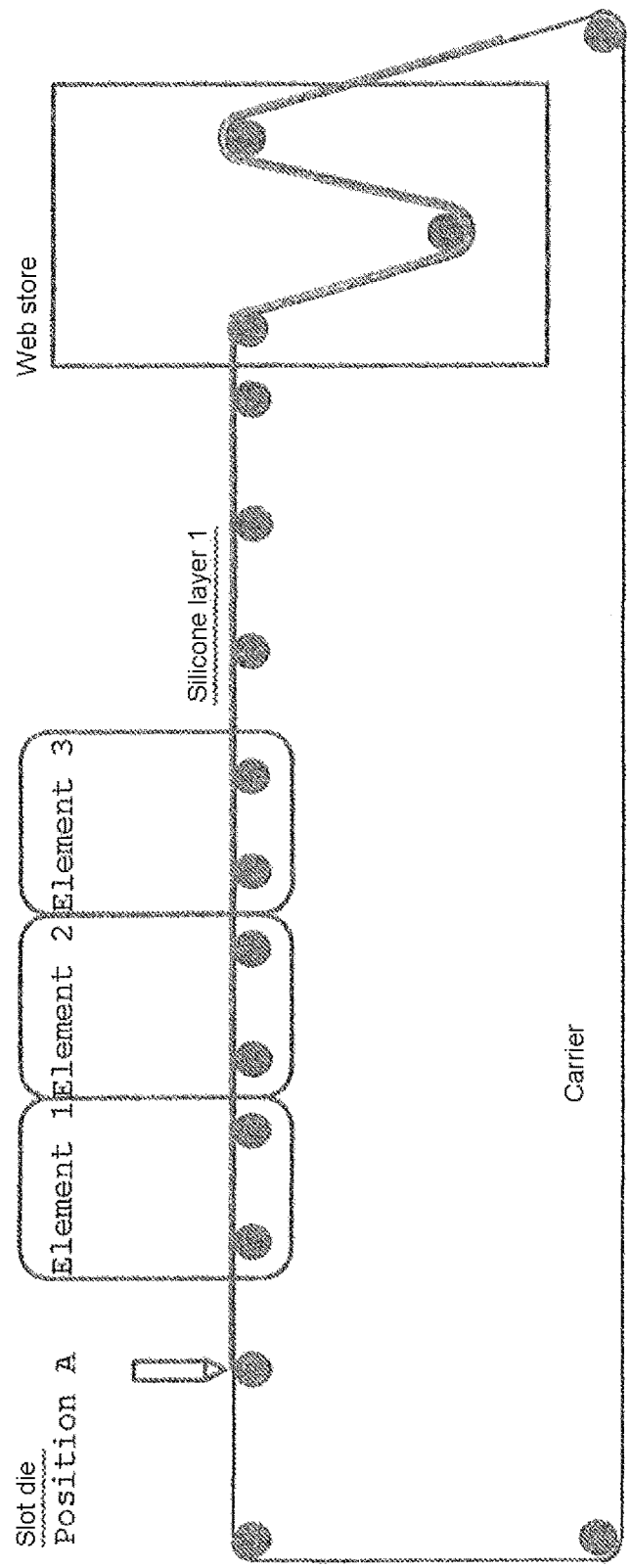
FIG. 5 illustrates a still further embodiment for the production of multilayer composites.

In FIG. 5, production takes place in the same way as for FIG. 1, but with this arrangement a continuous production of the multilayer silicone composite as per steps i) to vii) is possible with only one plant. An additional element used is a strip store, thereby increasing the length of the strip and hence of the multilayer silicone composite produced. In this case, the individual layers are applied and cured with the same slot die and with elements 1 to 3.

Figure 6:
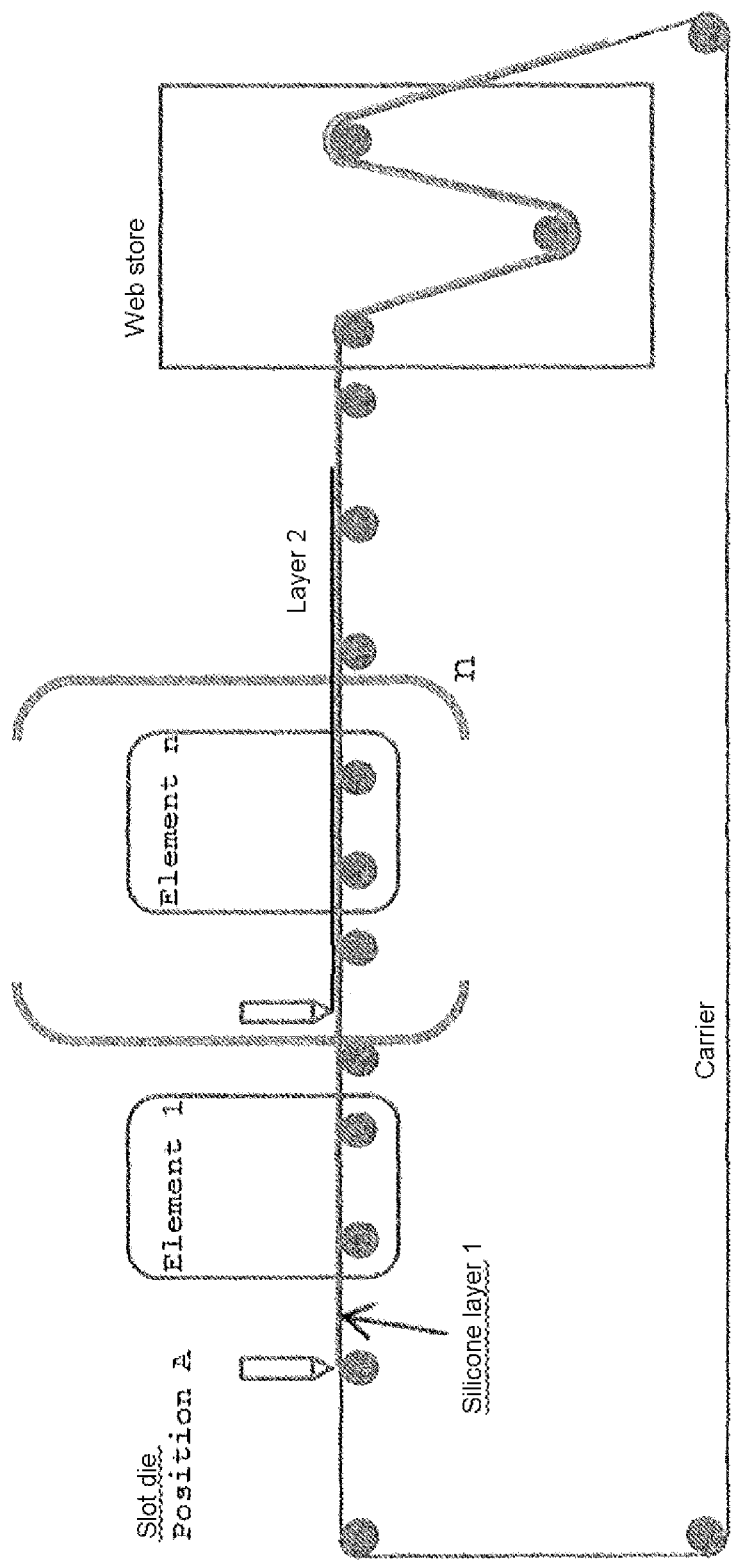
FIG. 6 illustrates an embodiment where multiple slit dies are used.

FIG. 6 is carried out in the same way as for FIG. 5, with the difference that additionally there is at least one further application point in the apparatus (i.e., n=1, 2, 3 . . . ), meaning that different slot dies and elements are used for different layers, with the number of application points actually installed being unimportant. Particularly in the case where a continuous strip is used, the desired layer sequence can easily be repeated.

As silicone compositions (X) it is possible in principle to use all of the silicones known to the state of the art. Addition-crosslinking, peroxidically crosslinking, condensation-crosslinking, or radiation-crosslinking compositions may be used. Preference is given to peroxidically or addition-crosslinking compositions. Particularly preferred are addition-crosslinking compositions.

Addition-crosslinking silicone compositions (X) used in accordance with the invention are known in the prior art and comprise in their most simple form:
(A) at least one of linear compounds having radicals with aliphatic carbon-carbon multiple bonds,
(B) at least one linear organopolysiloxane having Si-bonded hydrogen atoms,
or instead of (A) and (B)
(C) at least one linear organopolysiloxane having SiC-bonded radicals with aliphatic carbon-carbon multiple bonds, and having Si-bonded hydrogen atoms, and
(D) at least one hydrosilylation catalyst.

The addition-crosslinking silicone compositions (X) may be either one-component silicone compositions or two-component silicone compositions.

In the case of two-component silicone compositions, the two components of the addition-crosslinking silicone compositions (X) of the invention may comprise all constituents in any desired combination, generally with the proviso that one component does not simultaneously comprise siloxanes with aliphatic multiple bond, siloxanes with Si-bonded hydrogen, and catalyst, in other words essentially does not simultaneously comprise constituents (A), (B), and (D), or (C) and (D).

The compounds (A) and (B) and, respectively, (C) that are used in the addition-crosslinking silicone compositions (X) of the invention are selected, as is known, such that crosslinking is possible. Thus, for example, compound (A) has at least two aliphatically unsaturated radicals, and (B) has at least three Si-bonded hydrogen atoms, or compound (A) has at least three aliphatically unsaturated radicals and siloxane (B) has at least two Si-bonded hydrogen atoms, or else siloxane (C) is used instead of compound (A) and (B), this siloxane (C) having aliphatically unsaturated radicals and Si-bonded hydrogen atoms in the proportions stated above. Also possible are mixtures of (A) and (B) and (C) having the above-designated proportions of aliphatically unsaturated radicals and Si-bonded hydrogen atoms.

The addition-crosslinking silicone composition (X) of the invention contains customarily 30-95 wt %, preferably 30-80 wt %, and more preferably 40-70 wt % of (A). The addition-crosslinking silicone composition (X) of the invention contains customarily 0.1-60 wt %, preferably 0.5-50 wt %, and more preferably 1-30 wt % of (B). If the addition-crosslinking silicone composition (X) of the invention comprises component (C), there is customarily 30-95 wt %, preferably 30-80 wt %, more preferably 40-70 wt % of (C) present in the formulation.

The compound (A) used in accordance with the invention may comprise silicon-free organic compounds having preferably at least two aliphatically unsaturated groups, and also organosilicon compounds having preferably at least two aliphatically unsaturated groups, or else mixtures thereof.

Examples of silicon-free organic compounds (A) are 1,3,5-trivinylcyclohexane, 2,3-dimethyl-1,3-butadiene, 7-methyl-3-methylene-1,6-octadiene, 2-methyl-1,3-butadiene, 1,5-hexadiene, 1,7-octadiene, 4,7-methylene-4,7,8,9-tetrahydroindene, methylcyclopentadiene, 5-vinyl-2-norbornene, bicyclo[2.2.1]hepta-2,5-diene, 1,3-diisopropenylbenzene, polybutadiene containing vinyl groups, 1,4-divinylcyclohexane, 1,3,5-triallylbenzene, 1,3,5-trivinylbenzene, 1,2,4-trivinylcyclohexane, 1,3,5-triisopropenylbenzene, 1,4-divinylbenzene, 3-methylhepta-1,5-diene, 3-phenylhexa-1,5-diene, 3-vinylhexa-1,5-diene, and 4,5-dimethyl-4,5-diethylocta-1,7-diene, N,N'-methylenebisacrylamide, 1,1,1-tris-(hydroxymethyl)propane triacrylate, 1,1,1-tris(hydroxy-methyl)propane trimethacrylate, tripropylene glycol diacrylate, diallyl ether, diallylamine, diallyl carbonate, N,N'-diallylurea, triallylamine, tris(2-methylallyl)amine, 2,4,6-triallyloxy-1,3,5-triazine, triallyl-s-triazine-2,4,6(1H,3H,5H)-trione, diallyl malonate, polyethylene glycol diacrylate, polyethylene glycol dimethacrylate, poly(propylene glycol) methacrylate.

As constituent (A), the addition-crosslinking silicone compositions (X) of the invention preferably comprise at least one aliphatically unsaturated organosilicon compound, in which case all aliphatically unsaturated organosilicon compounds used to date in addition-crosslinking compositions may be employed, such as, for example, silicone block copolymers having urea segments, silicone block copolymers having amide segments and/or imide segments and/or ester-amide segments and/or polystyrene segments and/or silarylene segments and/or carborane segments, and silicone graft copolymers having ether groups.

Organosilicon compounds (A) used that have SiC-bonded radicals with aliphatic carbon-carbon multiple bonds are preferably linear or branched organopolysiloxanes comprising units of the general formula (I)

$$R^4_a R^5_b SiO_{(4-a-b)/2} \qquad (I)$$

where
R$^4$ independently at each occurrence, identically or differently, is an organic or inorganic radical free from aliphatic carbon-carbon multiple bonds,
R$^5$ independently at each occurrence, identically or differently, is a monovalent, substituted or unsubstituted, SiC-bonded hydrocarbon radical having at least one aliphatic carbon-carbon multiple bond,
a is 0, 1, 2, or 3, and
b is 0, 1, or 2,
with the proviso that the sum a+b is less than or equal to 3 and there are at least 2 radicals R$^5$ per molecule.

Radical R$^4$ may comprise monovalent or polyvalent radicals, in which case the polyvalent radicals, such as divalent, trivalent, and tetravalent radicals, for example, join two or more, such as two, three, or four, for instance, siloxy units of the formula (I) to one another.

Further examples of R$^4$ are the monovalent radicals —F, —Cl, —Br, OR$^6$, —CN, —SCN, —NCO, and SiC-bonded, substituted or unsubstituted hydrocarbon radicals which may be interrupted by oxygen atoms or by the group —C(O)—, and also divalent radicals Si-bonded on both sides in accordance with formula (I). If radical R$^4$ comprises SiC-bonded, substituted hydrocarbon radicals, preferred substituents are halogen atoms, phosphorus-containing radicals, cyano radicals, —OR$^6$, —NR$^6$—, —NR$^6_2$, —NR$^6$—C(O)—NR$^6_2$, —C(O)—NR$^6_2$, —C(O)R$^6$, —C(O)OR$^6$, —SO$_2$-Ph, and —C$_6$F$_5$. In that case R$^6$, independently at each occurrence, identically or differently, denotes a hydrogen atom or a monovalent hydrocarbon radical having 1 to 20 carbon atoms, and Ph is the phenyl radical.

Examples of radicals R$^4$ are alkyl radicals such as the methyl, ethyl, n-propyl, isopropyl, n-butyl, iso-butyl, tert-butyl, n-pentyl, isopentyl, neopentyl, and tert-pentyl radicals, hexyl radicals such as the n-hexyl radical, heptyl radicals such as the n-heptyl radical, octyl radicals such as the n-octyl radical and isooctyl radicals such as the 2,2,4-trimethylpentyl radical, nonyl radicals, such as the n-nonyl radical, decyl radicals such as the n-decyl radical, dodecyl radicals such as the n-dodecyl radical, and octadecyl radicals such as the n-octadecyl radical, cycloalkyl radicals such as the cyclopentyl, cyclohexyl, cycloheptyl, and methylcyclohexyl radicals, aryl radicals such as the phenyl, naphthyl, anthryl, and phenanthryl radicals, alkaryl radicals such as the o-, m-, and p-tolyl radicals, xylyl radicals, and ethylphenyl radicals, and aralkyl radicals, such as the benzyl radical, and the α- and the β-phenylethyl radicals.

Examples of substituted radicals R$^4$ are haloalkyl radicals such as the 3,3,3-trifluoro-n-propyl radical, the 2,2,2',2',2'-hexafluoroisopropyl radical, the heptafluoroisopropyl radical, haloaryl radicals such as the o-, m-, and p-chlorophenyl radicals, —(CH$_2$)—N(R$^6$)C(O)NR$^6_2$, —(CH$_2$)$_o$—C(O)NR$^6_2$, —(CH$_2$)$_o$—C(O)R$^6$, —(CH$_2$)$_o$—C(O)OR$^6$, —(CH$_2$)$_o$—C(O)NR$^6_2$, —(CH$_2$)—C(O)—(CH$_2$)$_p$C(O)CH$_3$, —(CH$_2$)—O—CO—R$^6$, —(CH$_2$)—NR$^6$—(CH$_2$)$_p$—NR$^6_2$, —(CH$_2$)$_o$—O—(CH$_2$)$_p$CH(OH)CH$_2$OH, —(CH$_2$)$_o$(OCH$_2$CH$_2$)$_p$OR$^6$, —(CH$_2$)$_o$—SO$_2$-Ph, and —(CH$_2$)$_o$—O—C$_6$F$_5$, where R$^6$ and Ph correspond to the definition indicated therefor above, and o and p are identical or different integers between 0 and 10.

Examples of R$^4$ as divalent radicals Si-bonded on both sides in accordance with formula (I) are radicals which derive from the monovalent examples stated above for radical R$^4$ by virtue of an additional bond taking place through substitution of a hydrogen atom; examples of such radicals are —(CH$_2$)—, —CH(CH$_3$)—, —C(CH$_2$)$_2$—, —CH(CH$_3$)—CH$_2$—, —C$_6$H$_4$—, —CH(Ph)-CH$_2$—, —C(CF$_3$)$_2$—, —(CH$_2$)$_o$—C$_6$H$_4$—(CH$_2$)$_o$—, (CH$_2$)$_o$—C$_6$H$_4$—C$_6$H$_4$—(CH$_2$)$_o$—, —(CH$_2$O)$_p$—, (CH$_2$CH$_2$O)$_o$—, —(CH$_2$)$_o$—O$_x$—C$_6$H$_4$—SO$_2$—C$_6$H$_4$—O$_x$—(CH$_2$)$_o$—, where x is 0 or 1, and Ph, o, and p have the definition stated above.

Preferably radical R$^4$ comprises a monovalent, SiC-bonded, optionally substituted hydrocarbon radical which has 1 to 18 carbon atoms and is free from aliphatic carbon-carbon multiple bonds, more preferably a monovalent, SiC-bonded hydrocarbon radical which has 1 to 6 carbon atoms and is free from aliphatic carbon-carbon multiple bonds, and more particularly the methyl or phenyl radical.

Radical R$^5$ may comprise any desired groups amenable to an addition reaction (hydrosilylation) with an SiH-functional compound.

If radical R$^5$ comprises SiC-bonded, substituted hydrocarbon radicals, preferred substituents are halogen atoms, cyano radicals, and —OR$^6$, where R$^6$ has the above-stated definition.

Preferably radical R$^5$ comprises alkenyl and alkynyl groups having 2 to 16 carbon atoms such as the vinyl, allyl, methallyl, 1-propenyl, 5-hexenyl, ethynyl, butadienyl, hexadienyl, cyclopentenyl, cyclopenta-dienyl, cyclohexenyl, vinylcyclohexylethyl, divinyl-cyclohexylethyl, norbornenyl, vinylphenyl, and styryl radicals, with vinyl, allyl, and hexenyl radicals being particularly preferred for use.

The molecular weight of the constituent (A) may vary within wide limits, as for instance between 10$^2$ and 10$^6$ g/mol. Hence, for example, constituent (A) may comprise a relatively low molecular mass, alkenyl-functional oligosiloxane, such as 1,2-divinyltetramethyl-disiloxane, but may also be a high-polymer polydimethylsiloxane, for example with a molecular weight of 10$^5$ g/mol (number average determined by means of NMR), that possesses in-chain or terminal Si-bonded vinyl groups. The structure of the molecules forming the constituent (A) is also not fixed; in particular, the structure of a siloxane of relatively high molecular mass, in other words an oligomeric or polymeric siloxane, may be linear, cyclic, branched, or else resinous, network-like. Linear and cyclic polysiloxanes are preferably composed of units of the formula R$^4_3$SiO$_{1/2}$, R$^5$R$^4_2$SiO$_{1/2}$, R$^5$R$^4$SiO$_{1/2}$, and R$^4_2$SiO$_{2/2}$, where R$^4$ and R$^5$ have the definition indicated above. Branched and network-like polysiloxanes additionally include trifunctional and/or tetrafunctional units, with preference being given to those of the formulae R$^4$SiO$_{3/2}$, R$^5$SiO$_{3/2}$, and SiO$_{4/2}$. It will be appreciated that mixtures of different siloxanes satisfying the criteria of constituent (A) may also be used.

Particularly preferred as component (A) is the use of vinyl-functional, substantially linear polydiorgano-siloxanes having a viscosity of 0.01 to 500,000 Pa·s, more preferably of 0.1 to 100,000 Pa·s, in each case at 25° C.

As organosilicon compound (B) it is possible to use all hydrogen-functional organosilicon compounds which have also been employed to date in addition-crosslinkable compositions.

Organopolysiloxanes (B) used which have Si-bonded hydrogen atoms are preferably linear, cyclic, or branched organopolysiloxanes composed of units of the general formula (III)

$$R^4_c H_d SiO_{(4-c-d)/2} \quad (III)$$

where
R$^4$ has the definition stated above,
c is 0, 1, 2, or 3, and
d is 0, 1, or 2,
with the proviso that the sum of c+d is less than or equal to 3 and there are at least two Si-bonded hydrogen atoms per molecule.

The organopolysiloxane (B) used in accordance with the invention preferably contains Si-bonded hydrogen in the range from 0.04 to 1.7 percent by weight (wt %), based on the total weight of the organopolysiloxane (B).

The molecular weight of the constituent (B) may likewise vary within wide limits, as for instance between $10^2$ and $10^6$ g/mol. Thus constituent (B) may comprise, for example, an SiH-functional oligosiloxane of relatively low molecular mass, such as tetramethyldisiloxane, or alternatively may comprise a silicone resin having SiH groups or a high-polymeric polydimethylsiloxane that possesses SiH groups within the chain or terminally.

The structure of the molecules that form the constituent (B) is also not fixed; in particular, the structure of an SiH-containing siloxane of relatively high molecular mass, in other words oligomeric or polymeric, may be linear, cyclic, branched, or else resinous, network-like. Linear and cyclic polysiloxanes (B) are composed preferably of units of the formula $R^4_3SiO_{1/2}$, $HR^4_2SiO_{1/2}$, $HR^4SiO_{2/2}$, and $R^4_2SiO_{2/2}$, with R$^4$ having the definition indicated above. Branched and network-like polysiloxanes additionally include trifunctional and/or tetrafunctional units, with preference being given to those of the formulae $R^4SiO_{3/2}$, $HSiO_{3/2}$, and $SiO_{4/2}$, where R$^4$ has the definition indicated above.

It will be appreciated that mixtures of different siloxanes satisfying the criteria of constituent (B) may also be used. Particularly preferred is the use of low molecular mass, SiH-functional compounds such as tetrakis(dimethylsiloxy) silane and tetramethylcyclo-tetrasiloxane, and also of SiH-containing siloxanes of higher molecular mass, such as poly(hydrogen-methyl)siloxane and poly(dimethylhydrogenmethyl)-siloxane with a viscosity at 25° C. of 10 to 20,000 mPa·s, or similar SiH-containing compounds in which some of the methyl groups have been replaced by 3,3,3-trifluoropropyl or phenyl groups.

The amount of constituent (B) in the crosslinkable silicone compositions (X) of the invention is preferably such that the molar ratio of SiH groups to aliphatically unsaturated groups from (A) is 0.1 to 20, more preferably between 0.3 and 2.0.

The components (A) and (B) used in accordance with the invention are commercial products and/or may be prepared by methods that are common within chemistry.

Instead of component (A) and (B), the silicone compositions of the invention may comprise organopolysiloxanes (C), simultaneously having aliphatic carbon-carbon multiple bonds and Si-bonded hydrogen atoms. The silicone compositions of the invention may also comprise all three components (A), (B), and (C).

If siloxanes (C) are used, those concerned are preferably composed of units of the general formulae (IV), (V), and (VI)

$$R^4_f SiO_{4/2} \quad (IV)$$

$$R^4_g R^5 SiO_{3-g/2} \quad (V)$$

$$R^4_h HSiO_{3-h/2} \quad (VI)$$

where
R$^4$ and R$^5$ have the definition indicated for them above,
f is 0, 1, 2, or 3,
g is 0, 1, or 2, and
h is 0, 1, or 2,
with the proviso that per molecule there are at least 2 radicals R$^5$ and at least 2 Si-bonded hydrogen atoms.

Examples of organopolysiloxanes (C) are those comprising $SiO_{4/2}$, $R^4_3SiO_{1/2}$, $R^4_2R^5SiO_{1/2}$, and $R^4_2HSiO_{1/2}$ units, known as MP resins, and these resins may additionally contain $R^4SiO_{3/2}$ and $R^4_2SiO$ units, and also linear organopolysiloxanes substantially consisting of $R^4_2R^5SiO_{1/2}$/ $R^4_2SiO$, and $R^4HSiO$ units, with R$^4$ and R$^5$ meeting the aforementioned definition.

The organopolysiloxanes (C) preferably possess an average viscosity of 0.01 to 500,000 Pa·s, more preferably 0.1 to 100,000 Pa·s, in each case at 25° C. Organopolysiloxanes (C) are preparable by techniques that are common within chemistry.

As hydrosilylation catalyst (D) it is possible to use all of the catalysts known to the state of the art. Component (D) may be a platinum group metal, as for example platinum, rhodium, ruthenium, palladium, osmium, or iridium, or an organometallic compound, or a combination thereof. Examples of component (D) are compounds such as hexachloroplatinic(IV) acid, platinum dichloride, platinum acetylacetonate, and complexes of said compounds encapsulated in a matrix or in a core/shell-like structure. The platinum complexes with low molecular weight of the organopolysiloxanes include 1,3-diethenyl-1,1,3,3-tetramethyldisiloxane complexes with platinum. Other examples are platinum-phosphite complexes or platinum-phosphine complexes. For photocuring or UV-curing compositions, for example, alkylplatinum complexes such as derivatives of cyclopentadienyltrimethylplatinum(IV), cyclooctadienyl-dimethylplatinum(II), or diketonato complexes, such as bisacetylacetonatoplatinum(II), for example, may be used in order to start the addition reaction by means of light. These compounds may be encapsulated within a resin matrix.

The concentration of component (D) for catalyzing the hydrosilylation reaction of components (A) and (B) and (C) on exposure is sufficient in order to generate the heat required here in the method described. The amount of component (D) may be between 0.1 and 1000 parts per million (ppm), 0.5 and 100 ppm, or 1 and 25 ppm of the platinum group metal, depending on the total weight of the components. The curing rate may be low if the constituent of the platinum group metal is below 1 ppm. The use of more than 100 ppm of the platinum group metal is uneconomic or lowers the storage stability of the silicone composition (X).

The addition-crosslinking silicone compositions (X) may optionally comprise all further additives which have also been used to date for the production of addition-crosslinkable compositions. Examples of reinforcing fillers (F), which may be used as a component in the addition-crosslinking silicone compositions (X) of the invention, are fumed or precipitated silicas having BET surface areas of at least 50 m$^2$/g, and also carbon blacks and activated carbons such as furnace black and acetylene black, with preference being given to fumed and precipitated silicas having BET surface areas of at least 50 m²/g. The stated silica fillers may have a hydrophilic character or may have been made hydrophobic by known methods. The amount of actively reinforcing filler in the crosslinkable silicone compositions (X) of the invention is within the range from 0 to 70 wt %, preferably 0 to 50 wt %.

With particular preference the crosslinkable, addition-crosslinking silicone compositions (X) are characterized in that the filler (E) is surface-treated. The surface treatment is obtained by the methods known in the state of the art for hydrophobizing finely divided fillers.

As a result of a surface treatment, preferred fillers (E) have a carbon content of at least 0.01 up to a maximum of 20 wt %, preferably between 0.1 and 10 wt %, more preferably between 0.5 to 5 wt %. Particular preference is given to those crosslinkable, addition-crosslinking silicone compositions (X) which are characterized in that the filler (E) is a surface-treated silica having 0.01 to 2 wt % of Si-bonded, aliphatically unsaturated groups. These groups are, for example, Si-bonded vinyl groups. In the addition-crosslinking silicone compositions (X) of the invention, the constituent (E) is used preferably as a single or likewise preferably as a mixture of two or more finely divided filler(s).

The addition-crosslinking silicone composition (X) of the invention may alternatively include as constituents further additions in a fraction of up to 70 wt %, preferably 0.0001 to 40 wt %. These additions may be, for example, inactive fillers, resinous polyorgano-siloxanes, different from the siloxanes (A), (B), and (C), reinforcing and nonreinforcing fillers, fungicides, fragrances, rheological additives, corrosion inhibitors, oxidation inhibitors, light stabilizers, flame retardants, and agents for influencing the electrical properties, dispersing assistants, solvents, adhesion promoters, pigments, dyes, plasticizers, organic polymers, heat stabilizers, etc. These include additions, such as finely ground quartz, diatomaceous earth, clays, chalk, lithopone, carbon blacks, graphite, metal oxides, metal carbonates, metal sulfates, metal salts of carboxylic acids, metal dusts, fibers, such as glass fibers, polymeric fibers, polymeric powders, dyes, pigments, etc.

These fillers, moreover, may be heat-conducting or electrically conducting. Examples of heat-conducting fillers are aluminum nitride; aluminum oxide; barium titanate; beryllium oxide; boron nitride; diamond; graphite; magnesium oxide; particulate metal such as, for example, copper, gold, nickel, or silver; silicon carbide; tungsten carbide; zinc oxide, and a combination thereof. Heat-conducting fillers are known in the state of the art and are available commercially. For example, CB-A20S and Al-43-Me are aluminum oxide fillers in different particle sizes, available commercially from Showa-Denko, and AA-04, AA-2, and AAl-8 are aluminum oxide fillers which are available commercially from Sumitomo Chemical Company. Silver fillers are available commercially from Metalor Technologies U.S.A. Corp. of Attleboro, Mass., U.S.A. Boron nitride fillers are available commercially from Advanced Ceramics Corporation, Cleveland, Ohio, U.S.A. The reinforcing fillers include silica and short fibers such as KEVLAR-Kurzfaser®, for example. A combination may be used of fillers with different particle sizes and different particle size distributions.

The addition-crosslinking silicone composition (X) may comprise further optional components. The examples of further optional components include, among others, (F) one or more solvents, and (G) one or more inhibitors.

The addition-crosslinking silicone composition (X) may additionally optionally comprise a solvent (F). It should be ensured, however, that the solvent (F) has no adverse effects on the system as a whole. Suitable solvents (F) are known in the state of the art and are available commercially. The solvent (F) may be, for example, an organic solvent having 3 to 20 carbon atoms. The examples of solvents (F) include aliphatic hydrocarbons such as nonane, decalin, and dodecane, for example; aromatic hydrocarbons such as mesitylene, xylene, and toluene, for example; esters such as ethyl acetate and butyrolactone, for example; ethers such as n-butyl ether and polyethylene glycol monomethyl ethers, for example; ketones such as, for example, methyl isobutyl ketone and methyl pentyl ketone; silicone fluid such as, for example, linear, branched, and cyclic polydimethylsiloxanes, and combinations of these solvents (F). The optimum concentration of a particular solvent (F) in the addition-crosslinking silicone composition (X) may be determined easily by means of routine experiments. Depending on the weight of the compound, the amount of the solvent (F) may be between 0 and 95 wt % or between 1 and 95 wt %.

The addition-crosslinking silicone composition (X) may additionally optionally comprise (G) inhibitors and stabilizers. Inhibitors and stabilizers (G) serve for the targeted setting of the processing life, onset temperature, and cross-linking rate of the addition-crosslinking silicone composition (X) of the invention. These inhibitors and stabilizers (G) are very well known within the field of addition-crosslinking compositions. Examples of commonplace inhibitors are acetylenic alcohols, such as 1-ethynyl-1-cyclohexanol, 2-methyl-3-butyn-2-ol, and 3,5-dimethyl-1-hexyn-3-ol, 3-methyl-1-dodecyn-3-ol, polymethylvinylcyclosiloxanes such as 1,3,5,7-tetravinyltetramethyltetracyclosiloxane, low molecular mass silicone oils with methylvinyl-$SiO_{1/2}$ groups and/or $R_2vinylSiO_{1/2}$ end groups, such as divinyltetramethyldisiloxane, etravinyldimethyldisiloxane, trialkyl cyanurates, alkyl maleates, such as diallyl maleates, dimethyl maleate, and diethyl maleate, alkyl fumarates, such as diallyl fumarate and diethyl fumarate, organic hydroperoxides such as cumene hydroperoxide, tert-butyl hydroperoxide, and pinane hydroperoxide, organic peroxides, organic sulfoxides, organic amines, diamines and amides, phosphates and phosphites, nitriles, triazoles, diaziridines, and oximes. The activity of these inhibitor additives (G) is dependent on their chemical structure, and so the concentration must be determined individually. Inhibitors and inhibitor mixtures (G) are added preferably in a quantitative fraction of 0.00001 wt % to 5 wt %, based on the total weight of the mixture, preferably 0.00005 to 2 wt %, and more preferably 0.0001 to 1 wt %.

The following enumeration stands by way of example for silicone compositions (X) which are available commercially on the market and which are suitable for the production of thin layers by the method of the invention. Mostly they are addition-crosslinking silicone compositions (X). Depending on the viscosity of the commercial silicone compositions (X), solvent (F) may be added for better processing properties.

Materials from WACKER Chemie AG, Munich: ELASTOSIL® P series (7010, 7600, 7613, 7161-160, 7616-195, 7618, 7619, 7622, 7623, 7624, 7628, 7629, 7630, 7633, 7636, 7642-220, 7670, 671, 7676, 7682, 7683/15, 7683/25, 7683/47, 7683/50, 7683/55, 7684/60, 7685, 7686, 7687, 7688, 7700, 7710, 7720, 7731, 7742, 7770, 7707 US, 7915, . . . ), ELASTOSIL® M series (4115, 4125, 4370, 4400, 4440, 4441, 4470, 4600, 4601, 4615, 4630, 4635, 4640, 4645, 4641, 4643, 4644, 4670, 4647, 4648, 4670), ELASTOSIL® RT series (601, 602, 604, 607, 615, 617, 619, 620, 622, 623, 624, 625, 626, 627, 628, 629, 630, 633, 646, 670, 672, 675, 678, 685, . . . ), ELASTOSIL® SOLAR series (2000, 2200, 2202, 3210, . . . ), LSR: ELASTOSIL® LR series (3003/03, 3003/05, 3003/10, 3003/20, 3070/20, 3844/20, 3846/20, 3856/20, 3003/30, 3004/30, 3005/30, 3040/30, 3044/30, 3065/30, 3070/30, 3071/30, 3072/30, 3843/30, 3844/30, 3846/30, 3856/30, 3003/40, 3003/50, 3003/60, 3003/70, 3003/80, 3003/85, 3004/40, 3004/50, 3004/60, 3004/70, 3005/40, 3005/50, 3005/60, 3040/40, 3040/50, 3040/60, 3043/40, 3043/50, 3043/60, 3043/70, 3015/70, 3023/60, 3092/65, 3094/60, 3065/50, 3066/40, 3066/60, 3066/80, 3070/40, 3070/50, 3070/60, 3071/40, 3071/50, 3071/60, 3072/40, 3074/60, 3076/70, 3170/40, 3841/50, 3842/40, 3842/50, 3842/60, 3842/70, 3162, . . . ), ELASTOSIL® FLR series (3900/40, 3900/60, 3905/40, 3905/60, . . . ), HTV: ELASTOSIL® R series, WACKER SILGEL® series (610, 611, 612, 613, 616, 619, . . . ), SEMICOSIL® series, POWERSIL® series, LUMISIL® series, GENIOMER® series, SILPURAN⁻ series, DEHESIVE® series.

Sometimes a pretreatment of the carrier is an advantage as an additional process step ia).

Where such pretreatment takes place, this step ia) may take place, for example, via a dip treatment of the carrier. Other chemical or physical pretreatment techniques are likewise possible, with examples thereof being as follows: spray treatment, cleaning methods, degreasing methods, plasma treatment, or the deposition of layers (e.g.: fluorocarbon layers). Whether a pretreatment step ia) is necessary or useful depends on the carrier material used. If excessive chemical or physical attachment of the silicone elastomer to the carrier material used means that the film is unable to detach from the carrier after crosslinking, this can be prevented by a pretreatment of the carrier. In order to facilitate the parting of the silicone film from the carrier, the carrier is preferably treated with a release agent, in which case all of the release agents known to the state of the art may be used, such as the following, for example: detergents such as nonionic surfactants (polyalkylene glycol ethers, alkylglucosides, fatty alcohol propylates, alkylpolyglucosides, octylphenol ethoxylates, nonylphenol ethoxylates), anionic surfactants (alkyl carboxylates, alkylbenzenesulfonates, fatty alcohol sulfates), cationic surfactants (mostly quaternary ammonium compounds such as tetraalkylammonium halides or ester quats), or amphoteric surfactants (betaines, sulfobetaines). All commercial surfactants or surfactant mixtures may be used for a pretreatment, such as, for example, the Surfynol® series, the Dynol™ series, the EnviroGem® series, the Leunapon F series, the Leunapon FU series, the Leunapon P series, the Metaupon series, the Hansanol AS 240 series, the Hansanol NS-242 series, the Hansanol NS 243 series, the Hansanol NS 252 series, the Hansanol NS-262 series, the Hansanyl OS series, the Hansanid CFAD, the Hansanolat FA series, the Hansanolat NP series, the Hansateric CAPB series, the Cremophor® series, the Eusapon® series, the Jordapon® series, the AVANEL series, the Lutensit® series, the Lutensol series, the Pluracare® series, the Plurafac® series, or the Pluronic series.

The release agent or a mixture of different release agents and additives is used preferably in an aqueous, alcoholic, or aqueous-alcoholic mixture, with preferred alcohol components used being linear and branched aliphatic alcohols such as, for example, methanol, ethanol, propanol, butanol, pentanol, hexanol, heptanol, octanol, isopropanol, isobutanol, etc.

Prior to the application of the silicone composition (X) to the carrier it is preferred for the excess pretreatment material to be removed from the carrier again, something which is done preferably with the aid of squeezing and/or polishing rolls and/or polishing plates. Arrangement, size, speed, or number of the assemblies used play only a minor part. Preference, moreover, is given to the use of at least one polishing roll or polishing plate, particular preference to the use of a combination of squeezing rolls and polishing rolls.

The slot die in step i) and iv) is at an angle of between 10° and 90° relative to the carrier. Preferred angles are between 30° and 90°, and particularly preferred angles are between 50° and 90°.

In one preferred embodiment, the distance of the slot die from the carrier in step i) and from the 1st or further layer composite in step iv) is at least 2 µm, preferably at least 5 µm, greater than the layer thickness of the silicone film produced.

The mode of operation of the slot die is unimportant for the layer thickness calculations, since the method involved is a premetered method (bead mode, curtain mode, short curtain mode). Where necessary, a subatmospheric pressure may be applied to the slot die in order to achieve the mode at the stated speed. The mass flow rate of the silicone composition (X) is regulated and adjusted via suitable pumps, such as, for example, gear pumps, piston pumps, membrane pumps, etc.

Activation for the partial or complete crosslinking in steps ii) and also v) and vii) may take place thermally, via IR radiation, or via UV radiation, independently of one another. In the case of room-temperature-crosslinking systems, room temperature is sufficient for curing, and so there need be no additional supply of energy. Microwave activation or activation by ultrasound is also possible.

In the case of UV-crosslinking systems, the catalyst (D) of the hydrosilylation reaction of the addition-crosslinking silicone composition (X) is activated by irradiation in order to achieve partial or complete crosslinking. All of the light sources known to the state of the art may be used, such as LEDs, mercury vapor lamps, doped mercury vapor lamps, xenon lamps, or lasers, for example. Wavelengths irradiated with preference are between 250 and 800 nm, particular preference being given to wavelengths of between 300 and 500 nm. The arrangement of the light sources is arbitrary, and the distance between the light source and the silicone composition (X) for crosslinking may vary between a few millimeters and several centimeters.

The intermediate layers optionally applied in step iii) are dependent on the planned use. For example, conductive fine or coarse powders can be applied as an intermediate layer. Examples of suitable materials include graphites, carbon nanotubes, conductive carbon blacks, metal flakes, metal rods, and metal nanowires. Also included in this step is the targeted application of defined conductor tracks. Also, however, it is possible for other polymerizable compositions to be applied as intermediate layer, these compositions being able optionally to include fillers, examples being acrylates, epoxides, or polyurethanes, for example. The introduction of polymeric layers which have already undergone crosslinking, examples being ASA, ABS, A/MMA, BR, CA, CR, COC, EP, EPM, EPDM, EVA, FKM, UF, HIPS, MF, MBS, NR, PF PE, PP, PBT, PET, PU, BC, PI, PIB, PMMI, PMMA, PS, SB, PTFE, PVAC, PVB, PVC, PVDF, SAN, SBS, or TPU. Interlayers of organic inorganic materials such as glass or paper, for example, are likewise possible. Preferred interlayers are electrically conductive.

In the simplest case, the multilayer silicone composite of the invention is collected directly with the carrier. Further possibilities include parting the silicone film or the multilayer silicone composite of the invention from the carrier in an intermediate step va) and then collecting it, or transferring it from the carrier to a different carrier and then collecting it together with the other carrier.

Reasons for the necessity of the transfer to another carrier may be, for example, the deficient thermal or UV stability of the carrier, price differences between the carrier materials, surface properties, surface qualities, thickness, weight, etc. The step of carrier changeover has no influence at all on the other process steps.

Subsequently, the silicone film thus collected or the multilayer silicone composite may either be further-processed directly or stored pending further use. If the carrier is removed from the silicone film only as part of further processing, the point in time (whether before or after further processing) may play a part. Further processing of the multilayer silicone composite of the invention may take place with all of the methods known to the state of the art, for the shaping of the multilayer silicone composite of the invention, for example, in order to be able to use it in the desired application. Examples thereof, without restricting the invention, are cutting with diverse techniques such as knife, laser, water or particle jet, or punching. Also possible is fixing by means, for example, of adhesive bonding, etc.

A further subject of the present invention are multilayer silicone composites produced by the method of the invention, having independent layer thicknesses of the individual silicone layers of 0.1 to 200 µm, preferably of 1 to 150 µm, and more preferably of 2 to 100 µm, and in each case with a thickness precision of ±5% as measured over an area of 200 cm$^2$; preferably a thickness precision of in each case ±3%.

The multilayer silicone composites produced by the method of the invention described have the advantage, furthermore, that they can be used as dielectric electroactive polymers (EAP) in actuators, sensors, or generators.

In applications of EAPs in the area of actuators or of generators, in particular, several million oscillation cycles will be traversed in the course of the lifetime. One advantage of the multilayer silicone composites produced by means of the method of the invention is a very high long-term load resistance, resulting from the uniformity of and absence of particles from the multilayer silicone composites of the invention. For designing the operating voltage of the components, the properties specified above are likewise of utmost importance, since they possess a direct influence over the breakdown field strength. The maximum electrical field in turn has a direct influence on the efficiency and the performance of the actuators or generators.

Uniformity means that the layer thickness of the cured silicone layers over a particular area is subject to only minimal variation. In the case of multilayer silicone composites produced with the method of the invention, the individual cured silicone layer thickness varies at maximum by ±5% within an area of 200 cm$^2$ (=thickness precision). This would mean that, for example, an individual cured silicone layer having an average layer thickness of 100 µm, over an area of 200 cm$^2$, has no point at which the layer thickness is less than 95 µm or greater than 105 µm. Or, put alternatively, a silicone layer having an average layer thickness of 100 µm and a thickness precision of ±5% always has a thickness of at least 95 and not more than 105 µm over the entire area of 200 cm$^2$, irrespective of where on the 200 cm$^2$ area the layer thickness is determined.

A particular advantage of the production of multilayer composites in accordance with the invention is that different kinds of silicone compositions (X) can be used independently of one another, with the mechanical properties of the individual cured silicone layer then playing a minor part. Examples of this are hard/soft composites wherein at least one material is a silicone gel; hard/soft composites wherein at least one material represents a brittle, hard material; composites of silicones having different physical or chemical properties such as, for example, refractive index, thermal conductivity, electrical conductivity, etc.

Depending on application, a multiplicity of arrangements or constructions is conceivable for such systems, and can be achieved through stacking, folding, rolling, etc.

EXAMPLES

In the examples described below, all figures in parts and percentages are by weight unless otherwise indicated. Unless otherwise indicated, the examples below are carried out under a pressure of the surrounding atmosphere, in other words approximately at 1000 hPa, and at room temperature, in other words at 25° C., or at a temperature which comes about when the reactants are combined at room temperature without additional heating or cooling. All viscosity figures hereinafter relate to a temperature of 25° C. The examples below illustrate the invention, without having any restrictive effect.

The carrier used in the examples was a PET (polyethylene terephthalate) film from Mitsubishi Polymer Film GmbH (HOSTAPHAN®). Films of this kind are also available from other manufacturers, for example, MYLAR® (DuPont Teijin Films), MELINEX® (DuPont Teijin Films), SCOTCHPAK® (3M Company, St. Paul, Minn.).

A slot die from COATEMA Coating Machinery GmbH was used, the nature of this slot die playing no critical part as far as production is concerned. Alternatively, slot dies from other manufacturers (FMP Technology GmbH, Mitsubishi Heavy Industries, etc.) can also be used.

The absolute layer thickness is determined by means of an SEM analysis of a cryosection; the surface quality and roughness are determined by means of the Leica DCM 3D confocal microscope.

Abbreviations used are as follows:
Ex. Example
No. Number
PDMS Polydimethylsiloxane
LSR Liquid Silicone Rubber
HTV High-temperature vulcanizing (crosslinking)
wt % Weight percent, w/w
$U_w$ Substrate or web speed
ρ Density
h Wet film thickness
B Coating width Examples 1 to 5 were carried out by a method according to FIG. 1, with position A of the slot die being selected. In example 6 (comparative example, not inventive), the silicone composition was applied by means of a four-way bar applicator. Examples 7 to 10 were carried out by a method according to FIG. 3, with position A of the slot die being selected. The slot die angle was consistently 90°.

Example 1

Production of a 50 µm film from the RTV-2 material ELASTOSIL® P 7670 A/B (mixing ratio A:B=1:1, density to ISO 2811=1.03 g/cm$^3$, Shore A hardness to ISO 868=7, elongation at break to ISO 37=600%, tensile strength to ISO 37=1.8 N/mm², viscosity after mixing the components to ISO 3219=1800 mPa s at a shear rate of 1 s⁻¹, tear strength to ASTM D 624 B=2.1 N/mm). In order to establish a wet film thickness of 50 µm at a web speed of 1 m/min with a layer width of 0.3 m at the density given, the feed rate is 15.45 ml/min.

Measured layer thickness/surface roughness: 50±1.5 µm
Breakdown voltage to ASTM D 3755: 35 kV/mm Before clamping again into the coating unit, the silicone layer produced, which is present on the carrier material, is coated over 90% of the area with a conductive carbon black, by the brush application of a dispersion. Used as second layer, in turn, is the silicone material identified above, and a layer 20 µm thick is applied and crosslinked. The procedure is repeated twice, thus producing a layer construction composed of three electrically conductive layers and four insulating layers, the thickness at which the last silicone layer is produced being again 50 µm. The thickness precision of the overall layer composite is ±15 µm; the thickness precision of each individual layer is ±2 µm.

Example 2

Production of a 20 µm film from the RTV-2 material ELASTOSIL® P 7684/60 A/B (mixing ratio A:B=1:1, density to ISO 2811=1.08 g/cm³, Shore A hardness to ISO 868=12, elongation at break to ISO 37=600%, tensile strength to ISO 37=3 N/mm², viscosity after mixing the components to ISO 3219=1500 mPa s at a shear rate of 1 s⁻¹, tear strength to ASTM D 624 B=13 N/mm).

In order to establish a wet film thickness of 20 µm at a web speed of 2 m/min with a layer width of 0.3 m at the density given, the feed rate is 32.4 ml/min.

Measured layer thickness/surface roughness: 20±1 µm
Breakdown voltage to ASTM D 3755: 50 kV/mm In a second step, a layer with a thickness of 100 µm is applied to the vulcanized layer of ELASTOSIL® P 7684/60, the 100 µm layer being composed of Silpuran® 2110 (mixing ratio A:B=1:1, penetration to DIN ISO 2137 [¹⁄₁₀ mm] hollow cone 62.5 g, 60 s, viscosity after mixing the components to ISO 3219=30,000 mPa s at a shear rate of 1 s-1).

Example 3

Production of a 100 µm film from the LSR material ELASTOSIL® LR 3003/40, diluted, after or before the mixing of the component, to a solvent fraction of 50 vol % (alkane fraction, tradename ISOPAR-E, from ExxonMobil Chemical), (mixing ratio A:B=1:1, density to ISO 2811=1.0 g/cm³, Shore A hardness to ISO 868=42, elongation at break to ISO 37=610%, tensile strength to ISO 37=10 N/mm², tear strength to ASTM D 624 B=33 N/mm, viscosity after mixing the components to ISO 3219=5300 mPa s at a shear rate of 1 s⁻¹).

A layer thickness of the elastomer of 100 µm at 50 vol % solvent fraction, a wet film thickness of 200 µm with a web speed of 5 m/min and a layer width of 0.3 m at the given density requires a feed rate of 300 ml/min. The solvent is removed by evaporation prior to crosslinking. The detailed procedure for this process is unimportant with regard to the film to be produced. In this example, the web is run through a drying oven 3 m long and with three different temperature zones (first meter=120° C., second meter=140° C., third meter=165° C.) in order first to evaporate off the solvent and thereafter to bring about crosslinking of the material through the elevated temperature.

Measured layer thickness/surface roughness: 100±3 µm
Breakdown voltage to ASTM D 3755: 40 kV/mm Directly after crosslinking, a dispersion of electrically conducting carbon black particles (conductive carbon black) in Isopar E (90 wt % solvent) is applied with the aid of a printing head, after which, in a third step, following venting of the solvent from the conductive carbon black layer, a second, 25 µm layer of ELASTOSIL® P 7670 is applied and crosslinked. Subsequently a layer of conductive carbon black, a layer of ELASTOSIL® P 7670, a layer of conductive carbon black, and a layer of ELASTOSIL® LR 3003/40 (in Isopar E; see above) are applied.

Example 4

The procedure was same as for example 3, but with the difference that the web speed was 10 m/min, with a corresponding feed rate of 600 ml/min.

Measured layer thickness/surface roughness: 100±4 µm
Breakdown voltage to ASTM D 3755: 40 kV/mm Example 5

Production of a 200 µm film of a silicone having the following composition:

49% of a vinyl-terminated, linear polydimethylsiloxane having an average chain length of approximately 220.

23% of an Me₂Si—H-terminated, linear polydimethylsiloxane having an average chain length of approximately 220.

23% of a hydrophobized, fumed silica having a BET surface area of 130 m²/g

5% of a linear comb crosslinker having a chain length of approximately 220 units and an Si—H content of 0.15 wt %

The mixture further comprises 10 ppm of platinum catalyst (divinyltetramethyl-disiloxane complexes, based on the metal)

250 ppm of 1-ethynylcyclohexanol for setting the pot life.

Shore A hardness to ISO 868=26, density to ISO 2811=1.05 g/cm³, elongation at break to ISO 37=490%, tensile strength to ISO 37=5.9 N/mm², tear strength to ASTM D 624 B=11.6 N/mm, viscosity to ISO 3219=6900 mPa s at a shear rate of 1 s⁻¹.

In order to set a wet film thickness of 200 µm with a web speed of 10 m/min and a layer width of 0.3 m at the density given, the feed rate is 630 ml/min.

Measured layer thickness/surface roughness: 200±5 µm
Breakdown voltage to ASTM D 3755: >50 kV/mm A second, 200 µm layer of SILPURAN® 2112 is applied and crosslinked with the same parameters in a subsequent step after 80% curing of the first layer.

Example 6: (Comparative Example, not Inventive)

Production of a 50 µm film from the RTV-2 material ELASTOSIL® P 7670 A/B (mixing ratio A:B=1:1, density to ISO 2811=1.03 g/cm³, Shore A hardness to ISO 868=7, elongation at break to ISO 37=600%, tensile strength to ISO 37=1.8 N/mm², viscosity after mixing the components to ISO 3219=1800 mPa·s at a shear of 1 s⁻¹, tear strength to ASTM D 624 B=2.1 N/mm). The adjustment of the layer thickness to 50 µm is accomplished by manually adapting the distance between the four-way bar applicator used and the web. Measured layer thickness/surface roughness: 50±6 μm Breakdown voltage to ASTM D 3755: 22 kV/mm Example 7: (As Per FIG. 3 with Pretreatment)

The dipping bath in FIG. 3 is used, with a solution of 2 wt % of the commercial surfactant mixture Green Care No. 5 from Tana Chemie GmbH in water. The rotary speed of the squeezing rolls is the same as the web speed; that of the polishing rolls is five times the web speed.

Production of a 50 μm film from the RTV-2 material ELASTOSIL® P 7670 A/B (mixing ratio A:B=1:1, density to ISO 2811=1.03 g/cm$^3$, Shore A hardness to ISO 868=7, elongation at break to ISO 37=600%, tensile strength to ISO 37=1.8 N/mm$^2$, viscosity after mixing the components to ISO 3219=1800 mPa·s at a shear of 1 s$^{-1}$, tear strength to ASTM D 624 B=2.1 N/mm).

In order to establish a wet film thickness of 50 μm at a web speed of 1 m/min with a layer width of 0.3 m at the density given, the feed rate is 15.45 ml/min.

Measured layer thickness/surface roughness: 50±1.5 μm
Breakdown voltage to ASTM D 3755: 35 kV/mm Example 8: (As Per FIG. 3 with Pretreatment)

The dipping bath in FIG. 3 is used, with a solution of 2 wt % of the commercial surfactant mixture Green Care No. 5 from Tana Chemie GmbH in water. The rotary speed of the squeezing rolls is the same as the web speed; that of the polishing rolls is five times the web speed. The pretreatment step is carried out before the production of the first silicone layer, in order to facilitate subsequent detachment of the multilayer composite from the carrier.

Production of a 20 μm film of a silicone having the following composition:

35 wt % of a vinyl-terminated, linear polydimethyl-siloxane having an average chain length of approximately 600.

15 wt % of a vinyl-terminated, linear polydimethyl-siloxane having an average chain length of approximately 220.

50 wt % of a linear comb crosslinker, Me$_2$SiH-terminated, having a chain length of approximately 220 units and an Si—H content of 0.015 wt %

The mixture further comprises 10 ppm of platinum catalyst (divinyltetramethyl-disiloxane complexes, based on the metal)

250 ppm of 1-ethynylcyclohexanol for setting the pot life.

Shore A hardness to ISO 868=2, density to ISO 2811=0.97 g/cm$^3$, elongation at break to ISO 37=350%, tensile strength to ISO 37=1.9 N/mm$^2$, tear strength to ASTM D 624 B=2.6 N/mm, viscosity to ISO 3219=3500 mPa·s at a shear of 1 s$^{-1}$.

In order to set a wet film thickness of 20 μm with a web speed of 10 m/min and a layer width of 0.3 m at the density given, the feed rate is 64.02 ml/min.

Measured layer thickness/surface roughness: 20±1 μm
Breakdown voltage to ASTM D 3755: 35 kV/mm As a second layer, a layer with ELASTOSIL® RT 625 at a layer thickness of 50 μm is applied.

Example 9: (As Per FIG. 3 with Pretreatment)

The dipping bath in FIG. 3 is used, with a solution of 2 wt % of the commercial surfactant mixture Green Care No. 5 from Tana Chemie GmbH in water. The rotary speed of the squeezing rolls is the same as the web speed; that of the polishing rolls is five times the web speed. The pretreatment step is carried out before the production of the first silicone layer, in order to facilitate subsequent detachment of the multilayer composite from the carrier.

As first layer, 50 μm ELASTOSIL® P 7670 are applied with a belt speed of 10 m/min; the data relating to the flow rate of material is evident from the calculations already shown in the examples above.

Subsequently a conductive ink is applied with a layer thickness of at least 100 nm to the first silicone layer.

As a third layer, a 0.5 μm thick silicone layer having the following composition is applied:

49 wt % of a vinyl-terminated, linear polydimethyl-siloxane having an average chain length of approximately 220.

23 wt % of an Me$_2$Si—H-terminated, linear polydimethyl-siloxane having an average chain length of approximately 220.

23 wt % of a hydrophobized, fumed silica having a BET surface area of 130 m$^2$/g 5 wt % of a linear comb crosslinker having a chain length of approximately 220 units and an Si—H content of 0.15 wt %

The mixture further comprises 10 ppm of platinum catalyst (divinyltetramethyl-disiloxane complexes, based on the metal)

250 ppm of 1-ethynylcyclohexanol for setting the pot life.

Prior to the application, 1 l of mixture is diluted with 3 l of solvent (alkane fraction, tradename Isopar E); the density of the solution is 0.98 g/cm$^3$, the viscosity of the solution to ISO 3219=30 mPa·s at a shear of 1 s$^{-1}$.

Shore A hardness to ISO 868=26, elastomer density to ISO 2811=1.05 g/cm$^3$, elongation at break to ISO 37=490%, tensile strength to ISO 37=5.9 N/mm$^2$, tear strength to ASTM D 624 B=11.6 N/mm, viscosity to ISO 3219=6900 mPa·s at a shear of 1 s$^{-1}$.

Breakdown voltage to ASTM D 3755: 85 kV/mm

As a fourth layer, a conductive ink is applied with a layer thickness of at least 100 nm to the first silicone layer.

In a fifth application, 50 μm ELASTOSIL® P 7670 are applied with a belt speed of 10 m/min.

The invention claimed is:

1. A method for producing a multilayer silicone composite comprising at least two layers of cured silicone, each with a layer thickness of 0.1 to 200 and with a thickness precision of the silicone layers of ±5% as measured over an area of 200 cm$^2$, by the steps comprising:

i) applying a first solvent-containing or solvent-free, crosslinkable silicone composition through a slot of a first slot die to a moving carrier to form a first silicone layer, ii) subsequently removing the solvent, if present, from the first silicone layer which forms on the carrier film, and partially crosslinking the first silicone layer, such that the first silicone layer has a degree of crosslinking of at least 40% and at most 90%, iii) optionally applying one or more intermediate layers, to give a 1st layer composite, composed of carrier, a partially crosslinked first silicone layer, and optional intermediate layer(s), iv) applying a second solvent-containing or solvent-free, crosslinkable silicone composition through a slot of a second slot die to the moving 1st layer composite to form a second silicone layer, wherein the second solvent-containing or solvent-free crosslinkable silicone composition may be the same or different from the first solvent-containing or solvent-free crosslinkable silicone composition, v) subsequently removing the solvent, if present, from the second silicone layer which forms on the 1st layer composite, and partially crosslinking the second silicone layer such that it has a degree of crosslinking of at least 40% and at most 90%, vi) optionally repeating steps iii) to v) one or more times, vii) further crosslinking the silicone layers, and viii) subsequently optionally separating the resulting multilayer silicone composite from the carrier, with the following provisos:

the slot dies in steps i) and iv) may be the same or different, and are at an angle of between 10° and 90° to the carrier;

the travel speed of the carrier and of the 1st and also further silicone layer(s) in steps i) and iv) is between 0.1 and 1000 m/min;

the dynamic viscosity at 25° C. of the solvent-containing or solvent-free crosslinkable silicone compositions, measured according to DIN 53019, is between 100 mPa·s and 1000 Pa·s, the surfaces of the carrier contain no depressions or elevations which are larger than 5% of the film thicknesses to be produced, and particles which are greater than ⅓ of the silicone layer thicknesses are removed from each solvent-containing or solvent-free crosslinkable silicone composition before it is applied.

2. The method of claim 1, wherein the solvent-containing or solvent-free crosslinkable silicone composition contains crosslinkable silicone components which consist essentially of one or more Si—H-functional, non-resinous linear or branched organopolysiloxanes and one or more non-resinous linear or branched organopolysiloxanes bearing aliphatically unsaturated groups.

3. The method of claim 1, wherein the solvent-containing or solvent-free crosslinkable silicone composition contains crosslinkable silicone components which consist essentially of one or more Si—H-functional, linear organopolysiloxanes and one or more linear organopolysiloxanes bearing aliphatically unsaturated groups.

4. The method of claim 2, wherein the aliphatically unsaturated groups comprise vinyl groups.

5. The method of claim 1, wherein the solvent-containing or solvent-free crosslinkable silicone composition contains fumed or precipitated silica as a filler.

6. The method of claim 5, wherein at least one filler is a surface treated filler having a carbon content of from 0.01 to 20 wt. % based on the weight of the surface treated filler.

7. The method of claim 5, wherein at least one filler is a surface treated filler having 0.01 to 2 wt. % of aliphatically unsaturated groups based on the weight of the surface treated filler.

8. The method of claim 1, wherein the solvent-containing or solvent-free crosslinkable silicone composition is solvent-free.

9. The method of claim 2, wherein the solvent-containing or solvent-free crosslinkable silicone composition is solvent-free.

10. The method of claim 3, wherein the solvent-containing or solvent-free crosslinkable silicone composition is solvent-free.

11. The method of claim 6, wherein the solvent-containing or solvent-free crosslinkable silicone composition is solvent-free.

12. The method of claim 7, wherein the solvent-containing or solvent-free crosslinkable silicone composition is solvent-free.

* * * * *